(12) United States Patent
Sugawara et al.

(10) Patent No.: US 12,414,406 B2
(45) Date of Patent: Sep. 9, 2025

(54) SEMICONDUCTOR LIGHT-EMITTING DEVICE AND PHOTOCOUPLER

(71) Applicants: Kabushiki Kaisha Toshiba, Tokyo (JP); Toshiba Electronic Devices & Storage Corporation, Tokyo (JP)

(72) Inventors: Hideto Sugawara, Nonoichi Ishikawa (JP); Hiroaki Ootsuka, Kanazawa Ishikawa (JP); Naoki Murakami, Kitakyushu Fukuoka (JP); Takanobu Kamakura, Yokosuka Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 589 days.

(21) Appl. No.: 17/896,756

(22) Filed: Aug. 26, 2022

(65) Prior Publication Data

US 2023/0238483 A1 Jul. 27, 2023

(30) Foreign Application Priority Data

Jan. 24, 2022 (JP) .................. 2022-008908

(51) Int. Cl.
*H10H 20/818* (2025.01)
*H10F 55/25* (2025.01)
(Continued)

(52) U.S. Cl.
CPC ........... *H10H 20/818* (2025.01); *H10F 55/25* (2025.01); *H10F 77/50* (2025.01); *H10F 77/933* (2025.01);
(Continued)

(58) Field of Classification Search
CPC .... H10H 20/818; H10H 20/852; H10H 20/01; H10H 20/824; H10H 20/857; H10H 20/812
See application file for complete search history.

(56) References Cited

U.S. PATENT DOCUMENTS 5,619,519 A 4/1997 Hamada et al.
5,990,497 A 11/1999 Kamakura et al.
(Continued)

FOREIGN PATENT DOCUMENTS

JP H108-228047 A 9/1996
JP H10-74978 A 3/1998
(Continued)

OTHER PUBLICATIONS

Japanese Office Action issues in Japanese Patent Application No. 2022-008908, dated Dec. 25, 2024, in 5 pages.

*Primary Examiner* — Mark W Tornow
(74) *Attorney, Agent, or Firm* — Knobbe, Martens, Olson & Bear, LLP

(57) ABSTRACT

A semiconductor light-emitting device includes a GaAs (gallium arsenide) substrate of a cubic crystal, a light-emitting layer and a multi-semiconductor layer. The light-emitting layer being provided on the GaAs substrate. The light-emitting layer includes InGaAs (indium gallium arsenide) represented by a compositional formula In$_x$Ga1-$_x$As (0<x<1). The multi-semiconductor layer being provided on a front surface of the GaAs substrate between the GaAs substrate and the light-emitting layer. The multi-semiconductor layer is tilted with respect to a (100) plane of the cubic crystal. The multi-semiconductor layer includes a first layer and a second layer. The first and second layers are alternately stacked in a direction perpendicular to the front (Continued)

surface of the GaAs substrate. The first layer is different in composition from the second layer.

12 Claims, 7 Drawing Sheets

(51) Int. Cl.
*H10F 77/00* (2025.01)
*H10F 77/50* (2025.01)
*H10H 20/01* (2025.01)
*H10H 20/812* (2025.01)
*H10H 20/824* (2025.01)
*H10H 20/852* (2025.01)
*H10H 20/857* (2025.01)

(52) U.S. Cl.
CPC .......... *H10H 20/01* (2025.01); *H10H 20/812* (2025.01); *H10H 20/824* (2025.01); *H10H 20/852* (2025.01); *H10H 20/857* (2025.01)

(56) References Cited

U.S. PATENT DOCUMENTS

| | | | |
|---|---|---|---|
| 2009/0262770 | A1 | 10/2009 | Itoh et al. |
| 2010/0047947 | A1* | 2/2010 | Yashima .................. H01S 5/227 |
| | | | 438/40 |
| 2014/0124010 | A1* | 5/2014 | Vaudo .................... H10N 10/17 |
| | | | 438/54 |
| 2021/0167231 | A1* | 6/2021 | Cardwell .............. H10F 77/146 |
| 2021/0222317 | A1* | 7/2021 | D'Evelyn ............... C30B 33/06 |

FOREIGN PATENT DOCUMENTS

| | | | |
|---|---|---|---|
| JP | 2804736 | B2 | 9/1998 |
| JP | 2804737 | B2 | 9/1998 |
| JP | 2871609 | B2 | 3/1999 |
| JP | 2008-085301 | A | 4/2008 |

* cited by examiner

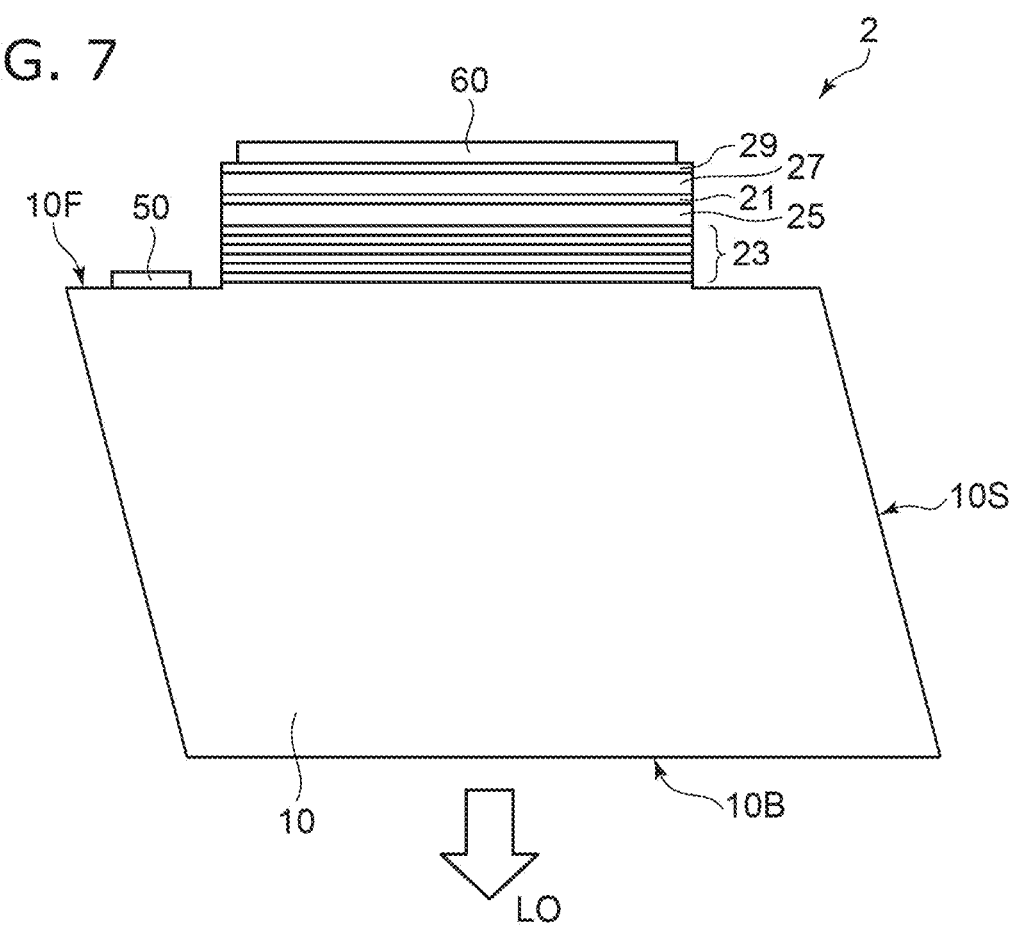
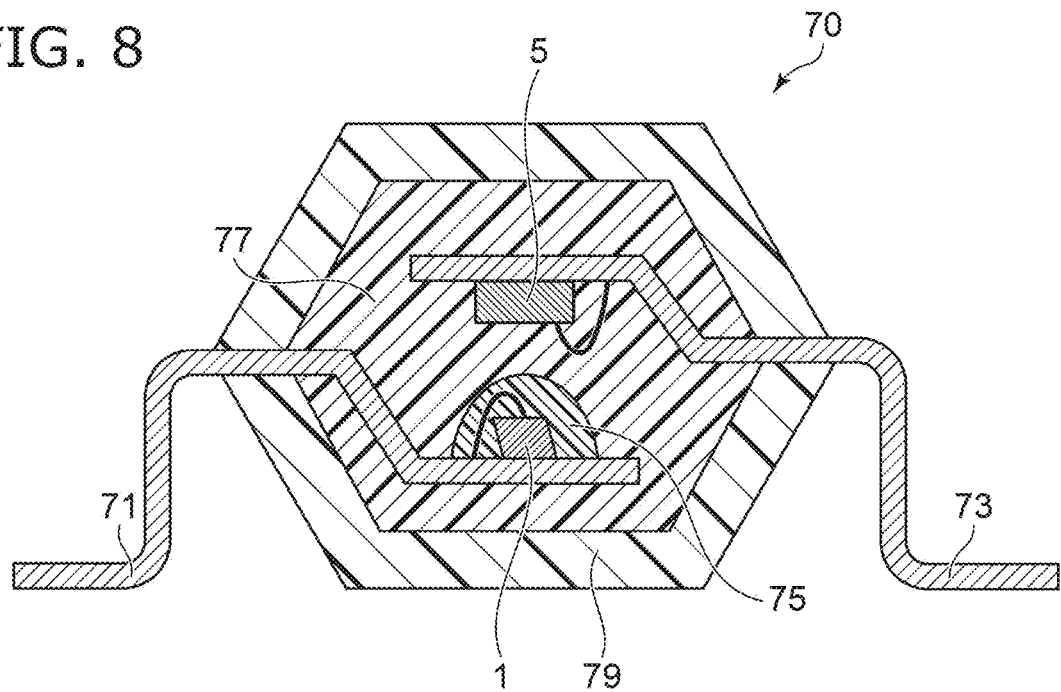

SEMICONDUCTOR LIGHT-EMITTING DEVICE AND PHOTOCOUPLER

CROSS-REFERENCE TO RELATED APPLICATIONS

This application is based upon and claims the benefit of priority from Japanese Patent Application No. 2022-008908, filed on Jan. 24, 2022; the entire contents of which are incorporated herein by reference.

FIELD

Embodiments relate to a semiconductor light-emitting device and a photocoupler.

BACKGROUND

A semiconductor light-emitting device is required to have high reliability. Stable operation and long life under high-temperature operating environments such as 105° C. is important for automotive applications and the like.

BRIEF DESCRIPTION OF THE DRAWINGS

FIG. 7 is a schematic cross-sectional view showing a semiconductor light-emitting device according to a modification of the embodiment; and FIG. 8 is a schematic cross-sectional view showing a photocoupler using the semiconductor light-emitting device according to the embodiment.

DETAILED DESCRIPTION

Figure 1A:
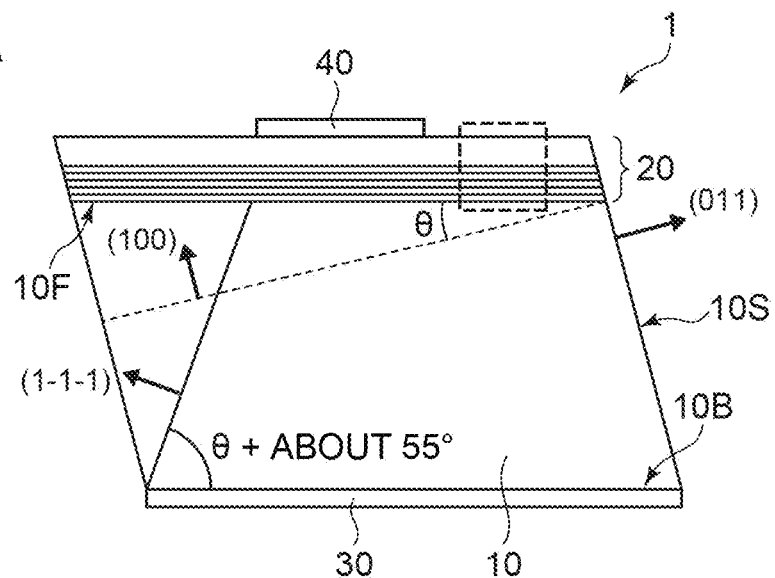
FIGS. 1A and 1B are schematic cross-sectional views showing a semiconductor light-emitting device according to an embodiment.

According to one embodiment, a semiconductor light-emitting device includes a GaAs (gallium arsenide) substrate of a cubic crystal, a light-emitting layer and a multi-semiconductor layer. The light-emitting layer being provided on the GaAs substrate. The light-emitting layer includes InGaAs (indium gallium arsenide) represented by a compositional formula InxGa1-xAs (0<x<1). The multi-semiconductor layer being provided on a front surface of the GaAs substrate between the GaAs substrate and the light-emitting layer. The multi-semiconductor layer is tilted with respect to a (100) plane of the cubic crystal. The multi-semiconductor layer includes a first layer and a second layer. The first and second layers are alternately stacked in a direction perpendicular to the front surface of the GaAs substrate. The first layer is different in composition from the second layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
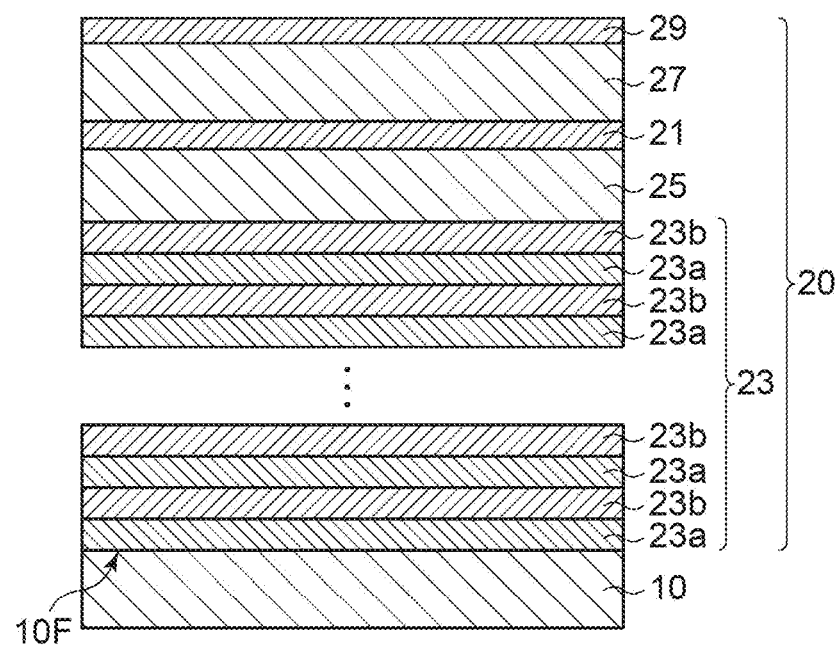

FIGS. 1A and 1B are schematic cross-sectional views showing a semiconductor light-emitting device 1 according to an embodiment. FIG. 1A is a cross-sectional view of the chip. FIG. 1B is a partial cross-sectional view showing the region surrounded with the broken line in FIG. 1A.

The semiconductor light-emitting device 1 is, for example, a light-emitting diode that emits near-infrared light. The semiconductor light-emitting device 1 includes a substrate 10 of cubic-crystal gallium arsenide (GaAs), an epitaxial layer 20, a first electrode 30, and a second electrode 40.

The GaAs substrate 10 has, for example, n-type conductivity. The GaAs substrate 10 includes a front surface 10F. The front surface 10F is tilted, for example, with respect to the (100) plane of the cubic crystal toward the (011) plane. The epitaxial layer 20 is provided on the front surface 10F of the GaAs substrate 10.

As shown in FIG. 1A, the GaAs substrate 10 has a side surface 10S that connects the front surface 10F and a back surface 10B. The side surface 10S is, for example, the (011) plane. The semiconductor light-emitting device 1 has the cross-sectional shape of, for example, a parallelogram in a cross section parallel to the (0-11) plane. When the front surface 10F has the tilt angle θ toward the (011) plane, the (1-1-1) plane of the cubic crystal is tilted θ+about 55° with respect to the back surface 10B.

The first electrode 30 is provided on the back surface 10B of the GaAs substrate 10. The first electrode 30 is, for example, an n-side electrode. The back surface 10B of the GaAs substrate 10 is positioned at the side opposite to the front surface 10F and is tilted with respect to the (100) plane.

The second electrode 40 is provided on the epitaxial layer 20. The second electrode 40 is, for example, a p-side electrode. The second electrode 40 is partially provided on the epitaxial layer 20.

As shown in FIG. 1B, the epitaxial layer 20 includes a light-emitting layer 21, a multi-semiconductor layer 23, an n-type cladding layer 25, a p-type cladding layer 27, and a p-type contact layer 29.

The light-emitting layer 21 includes indium gallium arsenide (hereinbelow, InGaAs) represented by the compositional formula $In_xGa_{1-x}As$ (0<x<1). InGaAs has lower rigidity (hardness) and a smaller Young's modulus than the GaAs substrate 10. InGaAs has a larger lattice constant than a lattice constant of the GaAs substrate 10 and provides, for example, a strained quantum well structure. The multi-semiconductor layer 23 is provided between the GaAs substrate 10 and the light-emitting layer 21.

The multi-semiconductor layer 23 is provided on the front surface 10F of the GaAs substrate 10. The multi-semiconductor layer 23 has, for example, n-type conductivity. The multi-semiconductor layer 23 includes at least one first layer 23a and at least one second layer 23b alternately stacked in a direction perpendicular to the front surface 10F of the GaAs substrate 10. The first layer 23a is different in a composition from the second layer 23b. The first layer 23a is different in a rigidity (hardness) from the second layer 23b.

The n-type cladding layer 25 is provided between the light-emitting layer 21 and the multi-semiconductor layer 23. The n-type cladding layer 25 includes, for example, aluminum gallium arsenide (hereinbelow, AlGaAs) represented by the compositional formula $Al_zGa_{1-z}As$ (0<z<1).

The p-type cladding layer 27 is provided on the light-emitting layer 21. The p-type cladding layer 27 includes, for example, AlGaAs. The light-emitting layer 21 is provided between the n-type cladding layer 25 and the p-type cladding layer 27.

The p-type contact layer 29 is provided on the p-type cladding layer 27. The p-type contact layer 29 includes, for example, GaAs. The second electrode 40 is provided on the p-type contact layer 29. The second electrode 40 is connected to the p-type contact layer 29 with, for example, an ohmic connection.

Figure 2:
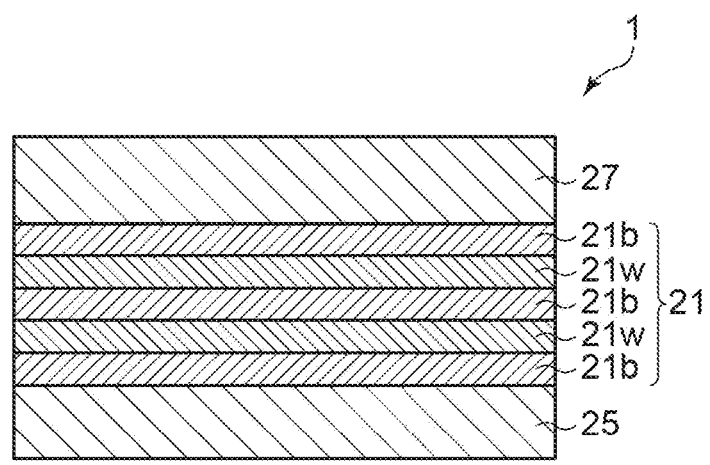
FIG. 2 is a schematic cross-sectional view showing the light-emitting layer of the semiconductor light-emitting device according to the embodiment.

FIG. 2 is a schematic cross-sectional view showing the light-emitting layer 21 of the semiconductor light-emitting device 1 according to the embodiment. The light-emitting layer 21 includes a quantum well layer 21w and a barrier layer 21b. The quantum well layer 21w and the barrier layer 21b are alternately stacked in the direction from the n-type cladding layer 25 toward the p-type cladding layer 27, i.e., in a direction perpendicular to the front surface 10F of the GaAs substrate 10 (see FIG. 1B). The quantum well layer 21w is provided between two adjacent barrier layers 21b. The quantum well layer 21w includes InGaAs. The barrier layers 21b include, for example, AlGaAs. The quantum well structure of InGaAs/AlGaAs provides a strained quantum well structure due to the lattice mismatch between the quantum well layer 21w and the GaAs substrate 10. The light emission wavelength thereof is, for example, 950 nm.

FIGS. 3A to 3D are schematic cross-sectional views showing manufacturing processes of the semiconductor light-emitting device 1 according to the embodiment. FIGS. 3A to 3D illustrate the chip singulation process of the semiconductor light-emitting device 1.

Figure 3A:
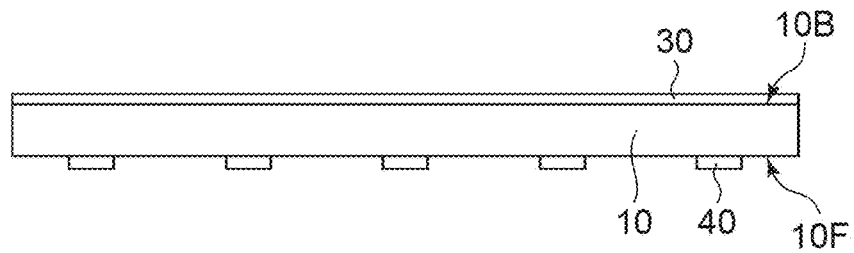
FIGS. 3A to 3D are schematic cross-sectional views showing manufacturing processes of the semiconductor light-emitting device according to the embodiment.

As shown in FIG. 3A, the first electrode 30 is formed on the back surface 10B of the GaAs substrate 10. The first electrode 30 is provided, for example, on the entire surface of the back surface 10B. The first electrode 30 is connected to the GaAs substrate 10 with an ohmic connection. The first electrode includes, for example, gold (Au) or silver (Ag) and serves as a reflective film of the light radiated from the light-emitting layer 21.

The multiple second electrodes 40 are formed at the front surface 10F side of the GaAs substrate 10. The second electrodes 40 are provided on the epitaxial layer 20 (see FIG. 1A) and are electrically connected to the p-type contact layer 29.

Figure 3B:
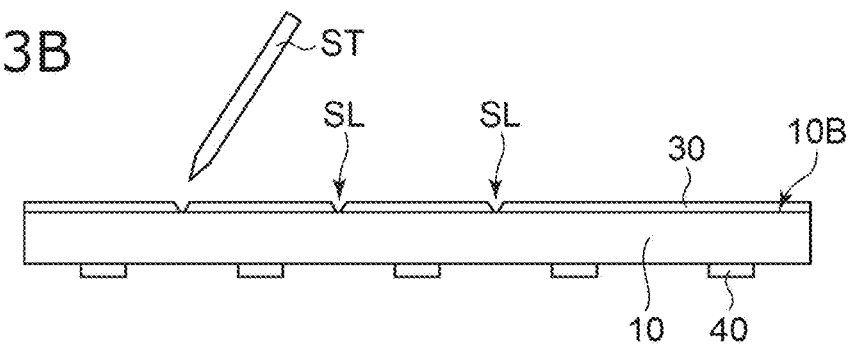

As shown in FIG. 3B, a scribe line SL is formed using a scriber ST in the back surface 10B side of the GaAs substrate 10. The scriber ST includes a diamond blade at the tip thereof. The scriber ST can form the groove-shaped scribe line SL to subdivide the first electrode 30. The groove-shaped scribe line SL reaches the GaAs substrate 10 at the back surface 10B side thereof. The scribe line SL is provided between two adjacent second electrodes 40 when viewed in a direction perpendicular to the back surface 10B.

Figure 3C:
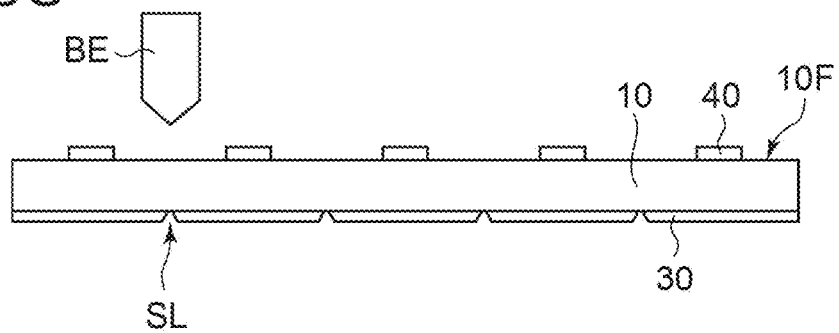

As shown in FIG. 3C, the GaAs substrate 10 is cleaved using a breaking blade BE at the front surface 10F side of the GaAs substrate 10. The breaking blade BE is pressed onto the front surface 10F at the position opposite to the scribe line SL. The GaAs substrate 10 is cleaved by the pressing of the breaking blade BE, and the scribe line SL serves as a starting point.

Figure 3D:
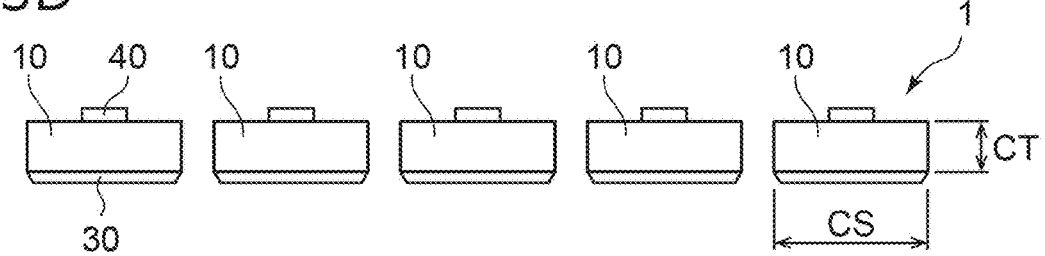

As shown in FIG. 3D, the GaAs substrate 10 is subdivided into multiple chips (semiconductor light-emitting devices 1). the semiconductor light-emitting device 1 has a chip size CS of, for example, 200 micrometers (μm). A chip thickness CT is, for example, 150 μm.

In such a chip dicing method, a mechanical damage such as micro defects and/or fracture layers is formed at the bottom of the scribe line SL that is formed in the back surface 10B of the GaAs substrate 10 and serves as the starting point of the cleaving. Therefore, the mechanical damage remains in the chip after the dicing. Although it is possible to remove such mechanical damage by, for example, etching the GaAs substrate 10 after the chip dicing, it may be difficult to remove all of the micro defects.

FIGS. 4A to 4D are cathodoluminescence (CL) images of the semiconductor light-emitting device 1 according to the embodiment. The chip used in the CL measurement was selected after the accelerated aging test for 500 hours performed under high temperature and high current conditions such as atmosphere temperature of 125° C. and operating current of 120 mA. The selected chip has an operating voltage for a prescribed light output which is changed more than 10% after the reliability test.

FIGS. 4A to 4D show CL images of the chip side surface (see FIG. 1A). The CL measurement observes a luminous phenomenon due to recombination of carriers (electrons and holes) excited by electron beam. Non-radiative recombination also occurs in which the excited carriers are trapped in defects. That is, when the crystal includes a defect, light is not emitted therearound.

Figure 4A:
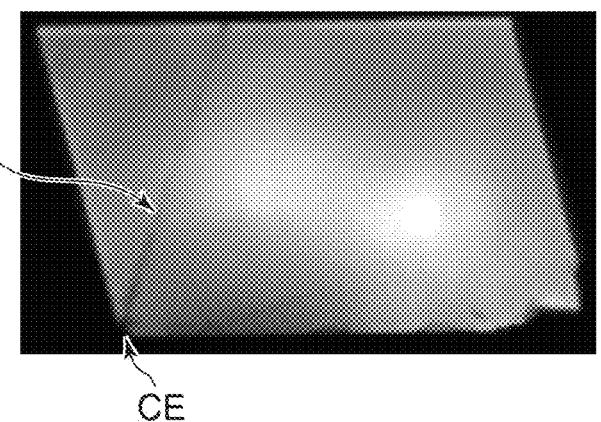
FIGS. 4A to 4D are cathodoluminescence (CL) images of the semiconductor light-emitting device according to the embodiment.

As seen in FIG. 4A, a dark line DL extends to the front surface of the epitaxial layer 20 from the corner at which the back surface 10B of the GaAs substrate 10 is connected to the chip cleavage plane, i.e., the (011) plane (see FIG. 1A). The dark line DL starts to extend from the corner at which the scribe line SL remains. The dark line extends along, for example, the (1-1-1) plane.

Figure 4B:
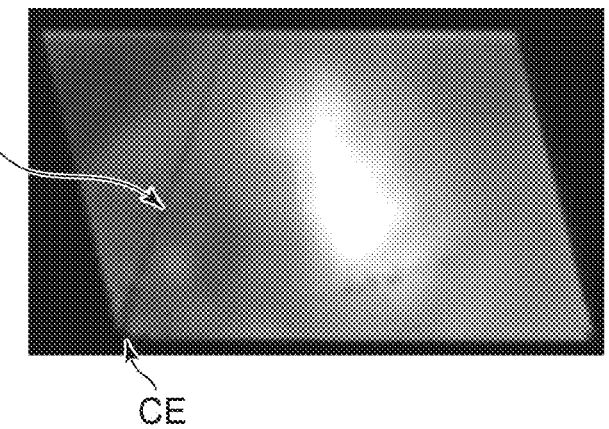

FIG. 4B is a CL image observed after etching the chip side surface about 30 μm. Also, in such a case, the dark line DL appears and extends to the front surface of the epitaxial layer 20 from the starting point of the corner at which the back surface 10B of the GaAs substrate 10 is connected to the (011) plane.

Figure 4C:
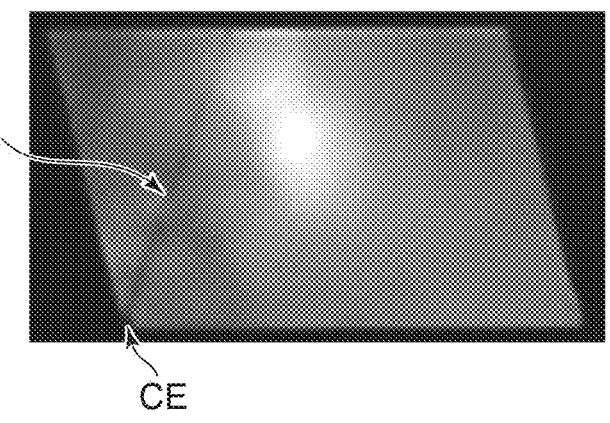

FIG. 4C is a CL image observed after further etching the chip side surface about 30 μm (i.e., for a total etching of 60 μm). The dark line DL extends to the front surface of the epitaxial layer 20 from the corner at which the back surface 10B of the GaAs substrate 10 is connected to the (011) plane.

Figure 4D:
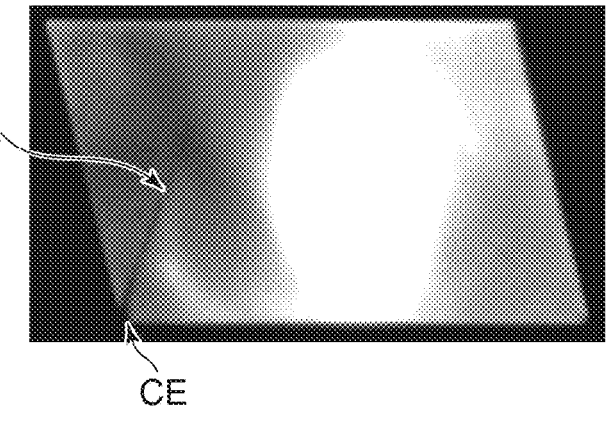

FIG. 4D is a CL image observed after further etching the chip side surface about 30 μm (for a total etching of 90 μm). The dark line DL extends into the GaAs substrate 10 from the starting point of the corner at which the back surface 10B of the GaAs substrate 10 is connected to the (011) plane.

These CL images show that the crystal defect spreads in a plane inside the GaAs substrate 10 from the corner at which the back surface 10B is connect to the cleavage plane of the GaAs substrate 10. In other words, the crystal defect is a planar dislocation along the (1-1-1) plane. In the CL image of FIG. 4D, the dark line DL does not reach the epitaxial layer 20; and the dislocation appears to extend from the starting point of the corner at which the back surface 10B is connected to the cleavage plane. In other words, the dislocation is found to extend inside the GaAs substrate 10 from the scribe line SL (see FIG. 3C) that is serves as the starting point. Such a dislocation gradually extends due to, for example, temperature changes in the operating environment. When the chip is sealed with a resin, such an extension of the dislocation may be accelerated by the resin stress.

Thus, in the accelerated aging test under high temperature and high current, there may be a case where a crystal defect remaining at the scribe line SL spreads over time and reaches the epitaxial layer 20. The light emission characteristics are degraded thereby. The test conditions described above assume a harsh environment of use, e.g., automotive applications. In such an environment, dislocation propagation that would not occur in a normal application is observed.

Generally, a reliability test is conducted under, for example, an operating current of 20 mA and a conduction time of 10000 hours at room temperature. Under such conditions, luminance degradation of, for example, 10% or more is not found. In contrast, when the reliability test is performed at the high temperature after sealing the chip with an epoxy resin, there may be a case where luminance degradation occurs due to the resin stress. It is possible to suppress such luminance degradation due to the resin stress by using a double resin-sealed structure (see FIG. 8) in which the chip is sealed with a silicone resin that is an inelastic resin having low plastic deformation, and then, sealed with an epoxy resin. However, even in the double resin-sealed structure, there may be a case where luminance degradation occurs in the accelerated aging test under high temperature and high current conditions as described above.

The multi-semiconductor layer 23 in the epitaxial layer 20 suppresses such dislocation propagation toward the light-emitting layer 21 by combining the first layer 23a and the second layer 23b that have different rigidities; and it is possible to improve the reliability of the semiconductor light-emitting device 1. The multi-semiconductor layer 23 changes, for example, a propagation direction of dislocation at each interface between the first layers 23a and the second layers 23b so that the dislocation does not reach the light-emitting layer 21. Or, the multi-semiconductor layer 23 can annihilate dislocations by combining each other. Under harsh accelerated conditions, however, such a dislocation suppression effect may be insufficient.

Example 1

The multi-semiconductor layer 23 (see FIG. 1B) can include, for example, indium aluminum phosphide (hereinbelow, InAlP) represented by the compositional formula $In_zAl_{1-z}P$ (0<z<1) and either GaAs or AlGaAs represented by the compositional formula $Al_vGa_{1-v}As$ (0≤v<1). The first layer 23a of the multi-semiconductor layer 23 is taken to be, for example, InAlP; and the second layer 23b is taken to be, for example, GaAs (v=0). The first and second layers 23a and 23b each have a layer thickness of 50 nanometers (nm). The multi-semiconductor layer 23 includes, for example, ten pairs of the first layer 23a and the second layer 23b. A similar advantage may be obtained even when the second layer 23b is AlGaAs (0<v<1).

The multi-semiconductor layer 23 is configured to transmit the light radiated from the light-emitting layer 21. The radiated light passes through the multi-semiconductor layer 23 and propagates inside the GaAs substrate 10. Thereby, the entire chip can be luminous. As seen in conventional art, in which a light-emitting device is provided with a Bragg reflector, the light is emitted with high directivity in the direction from the multi-semiconductor layer 23 toward the second electrode 40. In such a case, the multi-semiconductor layer 23 is configured to reflect the light radiated by the light-emitting layer 21. In an application such as a photo-coupler or the like, however, a light-emitting device preferably has low directivity. That is, it is preferable for the multi-semiconductor layer 23 to transmit the light radiated by the light-emitting layer 21. In other words, the light of the light-emitting layer 21 is preferably radiated not only from the upper surface of the chip but also from the side surfaces so that the entire chip is luminous.

Example 2

The multi-semiconductor layer 23 (see FIG. 1B) can include, for example, InGaAs and gallium arsenide phosphide (hereinbelow, GaAsP) represented by the compositional formula $GaAs_wP_{1-w}$ (0<w<1). The first layer 23a is taken to be $In_{0.1}Ga_{0.9}As$; and the second layer 23b is taken to be $GaAs_{0.9}P_{0.1}$. The first and second layers 23a and 23b each have a layer thickness of 10 nm. The multi-semiconductor layer 23 includes ten pairs of the first layer 23a and the second layer 23b.

The lattice constant of InGaAs has a magnitude relationship with respect to the lattice constant of GaAs that is the opposite magnitude relationship of the lattice constant GaAsP with respect to the lattice constant of GaAs. Also, InGaAs and GaAsP have different linear expansion coefficients. Therefore, it is possible in the multi-semiconductor layer 23 to compensate the lattice constant difference by the lattice strain within the elastic limit; and crystal defects due to the lattice mismatch do not occur. In the example, the elastic strain inside the multi-semiconductor layer 23 provides a large advantage of changing the propagation direction of the dislocation at the InGaAs/GaAsP interface. Thus, compared to the multi-semiconductor layer 23 of the example 1, the dislocation propagation is effectively suppressed in the accelerated aging test. Thereby, the characteristic degradation is suppressed, and the failure chips can be reduced.

Figure 5:
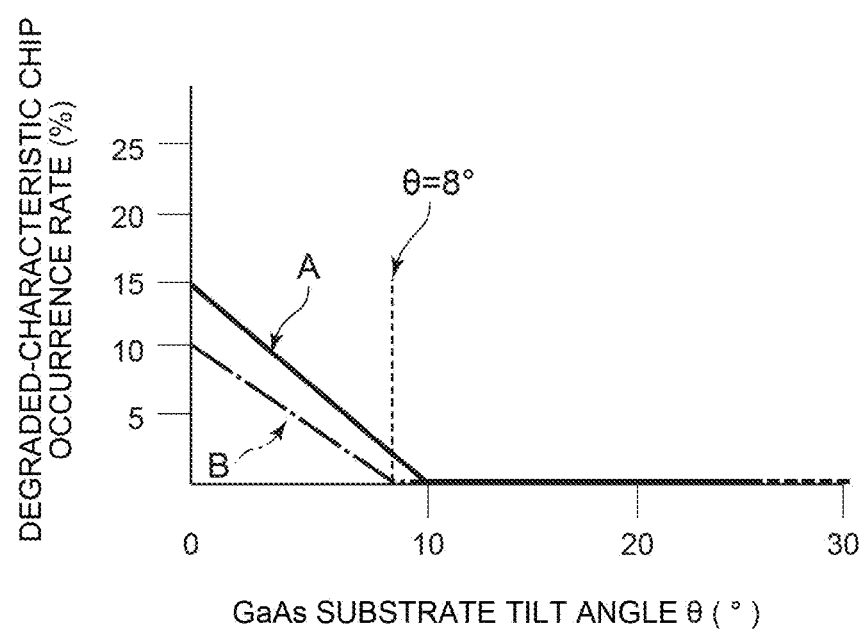
FIG. 5 is a graph showing a characteristic of the semiconductor light-emitting device according to the embodiment.

FIG. 5 is a graph showing a characteristic of the semiconductor light-emitting device 1 according to the embodiment. The horizontal axis is the tilt angle θ of the GaAs substrate 10 (see FIG. 1A). The vertical axis is the occurrence rate of degraded-characteristic chips in the accelerated aging test. In the figure, the graph shown by "A" illustrates a characteristic when the multi-semiconductor layer 23 of the example 1 is provided. The graph shown by "B" illustrates a characteristic when the multi-semiconductor layer 23 of the example 2 is provided.

In the example 1, the multi-semiconductor layer 23 includes InAlP and AlGaAs, and the degraded-characteristic chip occurrence rate is about 15% when the tilt angle θ is zero. The degraded-characteristic chip occurrence rate is 0% when the tilt angle θ is not less than 10°.

The same results are obtained even when the Al composition v of $Al_vGa_{1-v}As$ is changed from 0 to 0.2. Thus, it is found that there is tolerance of Al composition when AlGaAs is combined with InAlP, because of the rigidity of AlGaAs not greatly changed depending on the Al composition v.

In the example 2, the multi-semiconductor layer 23 includes InGaAs and GaAsP, the degraded-characteristic chip occurrence rate is about 10% when the tilt angle θ is zero, and the degraded-characteristic chip occurrence rate is 0% when the tilt angle θ is not less than 8°.

The propagation plane (1-1-1) of the dislocation has the tilt angle of θ+about 55° with respect to the back surface 10B of the GaAs substrate 10 (see FIG. 1A); and the penetration angle of the dislocation toward the multi-semiconductor layer 23 increases as the tilt angle θ increases. In other words, the larger penetration angle toward the multi-semiconductor layer 23 increases the change in the propagation direction of the dislocation, and suppresses the influence on the light-emitting layer 21. As the tilt of the front surface 10F in the GaAs substrate 10 is increased with respect to the (100) plane, the epitaxial layer 20 is found to have the improved crystallinity such as an improved surface morphology and like. Also, the combination of such improvements may affect the suppression of the dislocation propagation.

Thus, the reliability of the semiconductor light-emitting device 1 can be improved by tilting the front surface 10F of the GaAs substrate 10 with respect to the (100) plane. Moreover, the reliability can be ensured in harsher environments by providing the GaAs substrate 10 with the tilt angle θ of not less than 8°, and more preferably not less than 10°. On the other hand, it is difficult to obtain an epitaxial layer with few dislocations when the tilt angle θ reaches or exceeds 25°. Accordingly, the tilt angle θ is preferably not less than 8° and not more than 25°, and more preferably not less than 10° and not more than 25°.

Figure 6A:
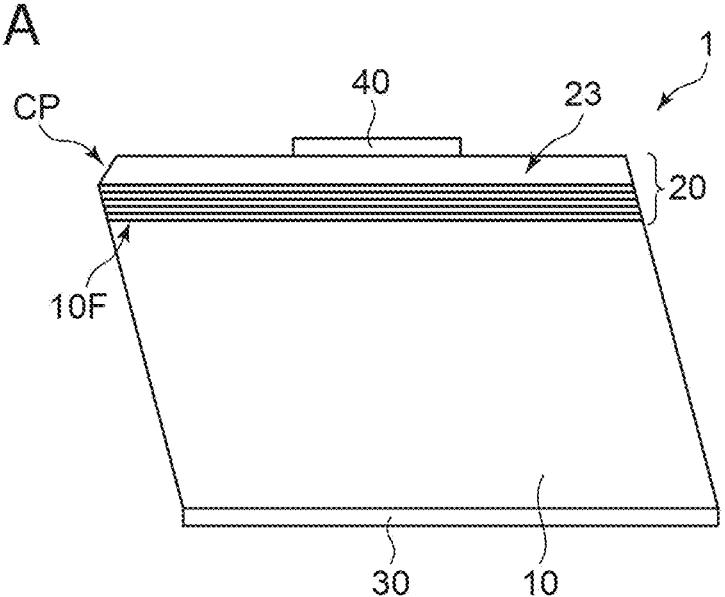
FIGS. 6A and 6B are schematic views illustrating the semiconductor light-emitting device according to the embodiment.
Figure 6B:
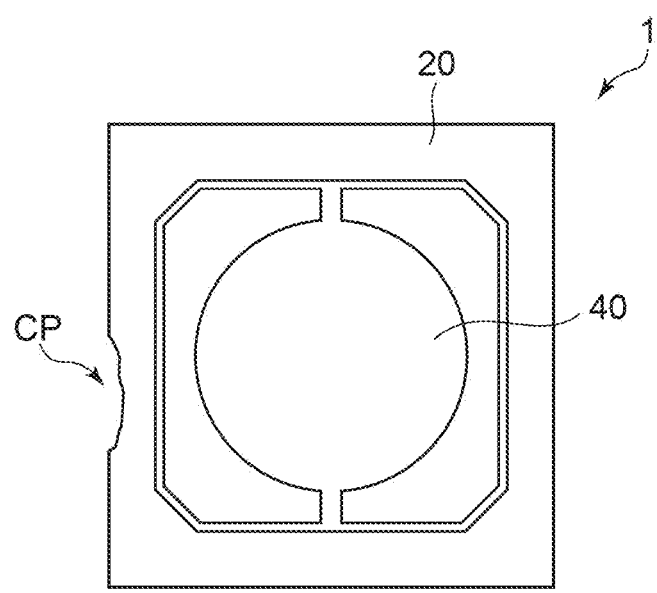

FIGS. 6A and 6B are schematic views illustrating the semiconductor light-emitting device 1 according to the embodiment. FIG. 6A is a cross-sectional view of the chip; and FIG. 6B is a plan view showing the chip surface.

As shown in FIG. 6A, the semiconductor light-emitting device 1 may have a crack CP in the edge of the upper surface of the epitaxial layer 20. The crack CP easily occurs due to the acute interior angle of the corner where the upper surface of the epitaxial layer 20 and the side surface 10S, i.e., the cleavage plane, cross. The acute interior angle is due to the GaAs substrate 10 being tilted with respect to the (100) plane. Also, the multi-semiconductor layer 23 is one origin causing such cracks CP to occur because of the different rigidities in the first and second layers 23a and 23b.

As shown in FIG. 6B, the crack CP is observed as a recess in one side of the chip upper surface. In the chip dicing process shown in FIGS. 3A to 3D, when the GaAs substrate 10 and the epitaxial layer 20 are divided along the cleavage plane, continuous cleaving from the scribe line SL to the upper surface of the epitaxial layer 20 is inhibited at the position of the multi-semiconductor layer 23. Such inhibition induces partially chipped outer edges at the upper surface of the epitaxial layer 20.

FIG. 7 is a schematic cross-sectional view showing a semiconductor light-emitting device 2 according to a modification of the embodiment. The semiconductor light-emitting device 2 includes the GaAs substrate 10, the light-emitting layer 21, the multi-semiconductor layer 23, a first electrode 50, and a second electrode 60.

As shown in FIG. 7, the epitaxial layer 20 includes the light-emitting layer 21, the multi-semiconductor layer 23, the n-type cladding layer 25, the p-type cladding layer 27 and the p-type contact layer 29, and is provided with a mesa structure. The first electrode 50 is provided on the front surface 10F of the GaAs substrate 10 that is exposed by mesa-patterning that reaches the GaAs substrate 10. The first electrode 50 is an n-side electrode. Alternatively, the mesa-patterning may be performed to reach the n-type cladding layer 25, and the first electrode 50 is provided on the n-type cladding layer 25 that is exposed by the mesa-structure.

The second electrode 60 is provided on the p-type contact layer 29. The second electrode 60 is a p-side electrode. The second electrode 60 includes, for example, gold (Au) or silver (Ag) and is configured to reflect the light radiated from the light-emitting layer 21 toward the second electrode 60 so that the light is emitted from the back surface 10B of the GaAs substrate 10.

In the semiconductor light-emitting device 2, the output light LO that is radiated in vertical directions from the light-emitting layer 21 propagates through the multi-semiconductor layer 23 and through the GaAs substrate 10. the output light LO is externally emitted from the back surface 10B of the GaAs substrate 10. Also, in the example, the multi-semiconductor layer 23 is configured to transmit the output light LO radiated from the light-emitting layer 21.

FIG. 8 is a schematic cross-sectional view showing a photocoupler 70 that comprises the semiconductor light-emitting device 1 according to the embodiment. The photocoupler 70 includes the semiconductor light-emitting device 1 and a light-receiving device 5. The semiconductor light-emitting device 1 and the light-receiving device 5 face each other and are optically coupled. In other words, the light-receiving device 5 detects the light emitted from the semiconductor light-emitting device 1.

As shown in FIG. 8, the semiconductor light-emitting device 1 is mounted on an input-side lead 71 and electrically connected thereto. The light-receiving device 5 is mounted on an output-side lead 73 and electrically connected thereto. The photocoupler 70 includes multiple input-side leads 71 and multiple output-side leads 73. The photocoupler 70 includes, for example, the input-side lead 71 that is electrically connected to the first electrode 30 of the semiconductor light-emitting device (see FIG. 1A) and another input-side lead 71 that is electrically connected to the second electrode 40 (see FIG. 1A) via a metal wire. The multiple output-side leads 73 include a pair of output-side leads 73 connected to an anode and a cathode of the light-receiving device, respectively.

The semiconductor light-emitting device 1 is sealed inside a first resin 75. The first resin 75 is, for example, a silicone resin. The first resin 75 transmits light emitted from the semiconductor light-emitting device 1.

The input-side lead 71 and the output-side lead 73 are arranged such that the semiconductor light-emitting device 1 faces the light-receiving device 5. Then, a second resin 77 is molded to cover each portion of the input-side lead 71 and the output-side lead 73. The semiconductor light-emitting device 1 is mounted on the portion of the input-side lead 71, and the light-receiving device 5 is mounted on the portion of the output-side lead 73. The second resin 77 covers the semiconductor light-emitting device 1 and the light-receiving device 5. The second resin 77 covers the light emitting device 1 with the first resin 75 interposed. The second resin 77 transmits the light emitted from the semiconductor light-emitting device 1. The second resin 77 is, for example, an epoxy resin.

A third resin 79 is molded to cover the second resin 77. The third resin 79 shields the light emitted from the semiconductor light-emitting device 1. The third resin 79 is, for example, an epoxy resin that includes carbon.

In the photocoupler 70, the semiconductor light-emitting device 1 is sealed with the first resin 75 that is an inelastic resin. The semiconductor light-emitting device 1 also is sealed via the first resin 75 with the second resin 77. The second resin 77 has a higher hardness than the first resin 75. By using such a double sealing structure, it is possible to reduce the resin stress applied to the semiconductor light-emitting device 1, and improve the reliability thereof.

As described above, in the semiconductor light-emitting devices 1 and 2, the multi-semiconductor layer 23 is provided between the GsAs substrate 10 and the light-emitting layer 21, and the front surface 10F of the GaAs substrate 10 is tilted with respect to the (100) plane. Thereby, it is possible in the semiconductor light-emitting devices 1 and 2 to prevent crystal defects generated in the chip dicing process from influencing on the reliability thereof. Such an advantage is more pronounced when the light-emitting layer 21 has, for example, a lower rigidity (hardness) than the GaAs substrate 10, and the multi-semiconductor layer 23 includes multiple layers that are mutually different in rigidities or linear expansion coefficients.

In other words, the multi-semiconductor layer 23 suppresses the propagation of dislocations from the GaAs substrate 10 toward the light-emitting layer 21. The suppressing effect of the dislocation propagation in the multi-semiconductor layer 23 can be increased by tilting the crystal growth surface of the GaAs substrate 10 with respect to the (100) plane. Such dislocation suppression effects are more pronounced because the light-emitting layer 21 of the semiconductor light-emitting device 1 includes the strained quantum well in which light emission characteristics are easily degraded by the dislocations propagating thereinto.

Embodiments are not limited to the example described above. For example, the chips can be diced using a dicing blade instead of scribing. Even when the dicing blade is used, the cutting surface may include defects; and the dislocations extend along crystal planes equivalent to a (111) plane. Accordingly, combining the multi-semiconductor layer 23 and the tilt of the front surface 10F of the GaAs substrate 10 is advantageous even when dicing is performed using the dicing blade.

The number of pairs of the first layer 23a and the second layer 23b in the multi-semiconductor layer 23 is not limited to ten; there may be a case where two or more pairs of the first layer 23a and the second layer 23b are sufficient. The propagation suppression of dislocations occurs at the interface between the first layer 23a and the second layer 23b. Accordingly, various modifications of the film thicknesses of the first and second layers 23a and 23b are possible.

Although the (011) plane is illustrated as the side surface 10S of the GaAs substrate 10, the side surface 10S is not limited thereto. For example, crystal planes equivalent to the (011) plane, i.e., (01-1), (0-1-1), and (0-11), may be used. In other words, dislocations propagate along the (1-11) plane when the front surface 10F of the GaAs substrate 10 is tilted with respect to the (01-1) plane. Dislocations propagate along the (111) plane when the tilt is toward the (0-1-1) plane; and dislocations propagate along the (11-1) plane when the tilt is toward the (0-11) plane.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light-emitting device, comprising:
a GaAs (gallium arsenide) substrate of a cubic crystal;
a light-emitting layer provided on the GaAs substrate, the light-emitting layer including InGaAs (indium gallium arsenide) represented by a compositional formula $In_xGa_{1-x}As$ (0<x<1); and
a multi-semiconductor layer provided on a front surface of the GaAs substrate between the GaAs substrate and the light-emitting layer, the multi-semiconductor layer being tilted with respect to a (100) plane of the cubic crystal,
the multi-semiconductor layer including a first layer and a second layer, the first layer and the second layer being alternately stacked in a direction perpendicular to the front surface of the GaAs substrate, the first layer being different in composition from the second layer.

2. The device according to claim 1, wherein
the front surface of the GaAs substrate is tilted 8 degrees to 25 degrees with respect to the (100) plane of the cubic crystal.

3. The device according to claim 2, wherein
the front surface of the GaAs substrate is tilted from the (100) plane in a direction toward a (011) plane, the (011) plane being orthogonal to the (100) plane.

4. The device according to claim 1, wherein
the GaAs substrate further includes a back surface and a side surface, the back surface being at a side opposite to the front surface, the side surface being connected to the front surface and the back surface, and
at least one of the side surface of the GaAs substrate or a corner connecting the side surface and the back surface of the GaAs substrate includes a crystal dislocation extending in a direction toward the multi-semiconductor layer.

5. The device according to claim 4, wherein
the crystal dislocation does not reach the light-emitting layer.

6. The device according to claim 4, wherein
the side surface of the GaAs substrate is a (011) plane of the cubic crystal or a crystal plane equivalent to the (011) plane.

7. The device according to claim 6, wherein
the crystal dislocation of the GaAs substrate extends along a crystal plane equivalent to a (111) plane of the cubic crystal.

8. The device according to claim 1, wherein
the multi-semiconductor layer transmits light radiated from the light-emitting layer.

9. The device according to claim 1, wherein
the first layer of the multi-semiconductor layer is an InAlP (indium aluminum phosphide) layer represented by a compositional formula $In_yAl_{1-y}P$ (0<y<1), and
the second layer is a GaAs layer or a AlGaAs (aluminum gallium arsenide) layer represented by a compositional formula $Al_vGa_{1-v}As$ (0≤v<1).

10. The device according to claim 1, wherein
the first layer of the multi-semiconductor layer is an InGaAs layer, and
the second layer is a GaAsP (gallium arsenide phosphide) layer represented by a compositional formula $GaAs_wP_{1-w}$ (0<w<1).

11. The device according to claim 1, wherein
the light-emitting layer is included in an epitaxial layer,
the epitaxial layer includes an upper surface positioned at a side opposite to the GaAs substrate, and
the epitaxial layer includes a partial recess at an outer edge of the upper surface.

12. A photocoupler, comprising:
a light-emitting device;
a first resin sealing the light-emitting device; and
a second resin covering the first resin and the light-emitting device sealed by the first resin, the second resin having a hardness greater than a hardness of the first resin,
the light-emitting device including a GaAs substrate of a cubic crystal, a light-emitting layer and a multi-semiconductor layer,
the light-emitting layer being provided on the GaAs substrate, and including InGaAs represented by a compositional formula $In_xGa_{1-x}As$ ($0<x<1$),
the multi-semiconductor layer being provided on a front surface of the GaAs substrate between the GaAs substrate and the light-emitting layer, the multi-semiconductor layer being tilted with respect to a (100) plane of the cubic crystal,
the multi-semiconductor layer including a first layer and a second layer, the first layer and the second layer being alternately stacked in a direction perpendicular to the front surface of the GaAs substrate, the first layer being different in composition from the second layer.

* * * * *